United States Patent
Liu et al.

(10) Patent No.: US 9,887,698 B2
(45) Date of Patent: Feb. 6, 2018

(54) INTERNAL CLOCK GATED CELL

(71) Applicant: TAIWAN SEMICONDUCTOR MANUFACTURING CO., LTD., Hsinchu (TW)

(72) Inventors: Chi-Lin Liu, New Taipei (TW); Lee-Chung Lu, Taipei (TW); Shang-Chih Hsieh, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/968,424

(22) Filed: Dec. 14, 2015

(65) Prior Publication Data
US 2017/0170829 A1 Jun. 15, 2017

(51) Int. Cl.
H03K 19/00 (2006.01)
H03K 3/037 (2006.01)
H03K 19/0948 (2006.01)
H03K 19/20 (2006.01)
H03K 3/012 (2006.01)
H03K 3/356 (2006.01)

(52) U.S. Cl.
CPC ......... H03K 19/0016 (2013.01); H03K 3/012 (2013.01); H03K 3/037 (2013.01); H03K 3/356121 (2013.01); H03K 19/0948 (2013.01); H03K 19/20 (2013.01)

(58) Field of Classification Search
CPC ............... H03K 3/037; H03K 19/0016; H03K 19/0948; H03K 19/20
See application file for complete search history.

(56) References Cited

U.S. PATENT DOCUMENTS

| | | | | |
|---|---|---|---|---|
| 5,537,062 A * | 7/1996 | Mote, Jr. | | H03K 5/1252 326/93 |
| 6,204,695 B1 * | 3/2001 | Alfke | | G06F 1/10 326/93 |
| 6,573,754 B2 * | 6/2003 | Menczigar | | H03K 5/1252 326/56 |
| 7,068,080 B1 * | 6/2006 | Sanders | | H03K 3/012 326/93 |
| 7,265,599 B1 | 9/2007 | Pasqualini | | |
| 9,035,686 B1 * | 5/2015 | Hsu | | H03K 3/35625 327/203 |

(Continued)

FOREIGN PATENT DOCUMENTS

KR 10-2015-0083769 A 7/2015
WO 2014/0179944 A1 11/2014

OTHER PUBLICATIONS

Massey University, "159.233 Computer Architecture", Semester 1, 2014, Lecture 4 <http://cs-alb-pc3.massey.ac.nz/notes/59233/>.

Primary Examiner — Alexander H Taningco
Assistant Examiner — Kurtis R Bahr
(74) Attorney, Agent, or Firm — Maschoff Brennan

(57) ABSTRACT

A circuit is disclosed that includes a latch and a logic circuit. The latch includes is configured to generate a gating control signal in response to a latch enable signal and an input clock signal. The latch includes a pair of logic gates each configured to perform multi-level compound logic function. The logic circuit is configured to receive the gating control signal and the input clock signal, and generate an output clock signal in response to the gating control signal and the input clock signal.

20 Claims, 9 Drawing Sheets

(56) References Cited

U.S. PATENT DOCUMENTS

| | | | |
|---|---|---|---|
| 2003/0201800 A1* | 10/2003 | Matsuo | H03K 3/356139 327/57 |
| 2010/0109707 A1 | 5/2010 | Srivastava et al. | |
| 2010/0174933 A1 | 7/2010 | Lu et al. | |
| 2012/0286824 A1* | 11/2012 | Myers | G06F 17/5059 326/93 |
| 2012/0299622 A1* | 11/2012 | Liu | G06F 1/3237 326/98 |
| 2013/0135017 A1* | 5/2013 | Jones | H03K 3/356173 327/142 |
| 2014/0184271 A1* | 7/2014 | Gurumurthy | H03K 19/0016 326/93 |
| 2015/0061741 A1* | 3/2015 | Balasubramanian | H03K 3/0372 327/202 |
| 2015/0162910 A1 | 6/2015 | Liu et al. | |
| 2015/0200652 A1 | 7/2015 | Berzins et al. | |
| 2016/0294371 A1* | 10/2016 | Tomatsopoulos | H03K 3/037 |

\* cited by examiner

US 9,887,698 B2

INTERNAL CLOCK GATED CELL

BACKGROUND

In a digital system including various synchronous circuits, a clock is used to synchronize all parts together. As semiconductor technologies advance, frequency of clock signals increases and power consumption of the clock network increases accordingly. In that situation, internal clock gating (ICG) is a technique to reduce the total clock network power dissipation. In some approaches, the internal clock gating technique is used to disable the clock signal for some circuits of the digital system when they are not in use during some clock cycles.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
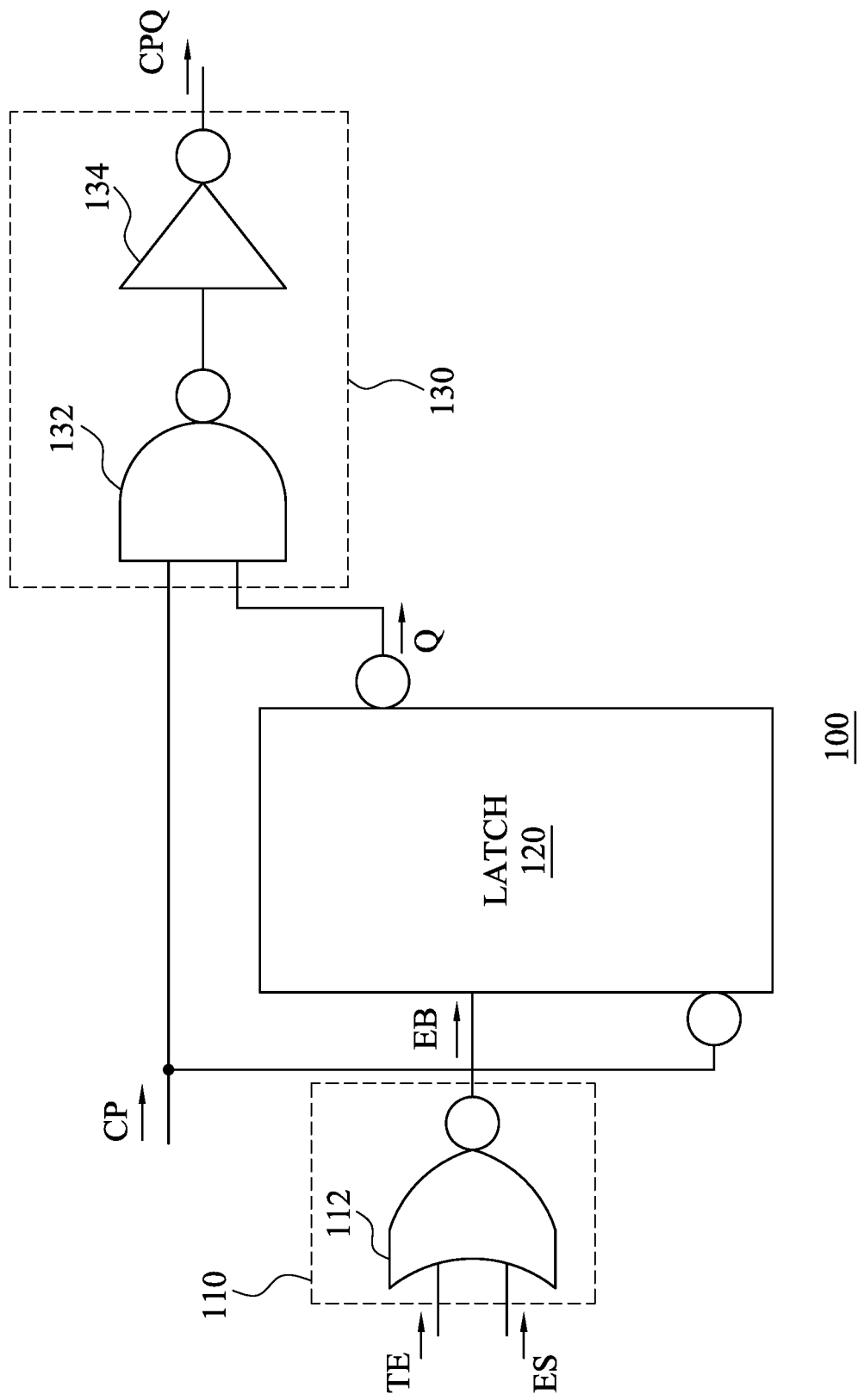
FIG. 1 is a schematic diagram of an internal clock gated cell in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

With increasing clock frequencies used in synchronous integrated circuit (IC) devices, dynamic power consumption is an ongoing concern for the IC devices. For some IC devices, most of the total dynamic power consumption is attributed to clock distribution networks. In order to reduce the dynamic power consumption of the clock distribution networks, internal clock gated (ICG) circuits that selectively gate clock signals in the IC devices are employed.

For illustration, the internal clock gated circuit selectively prunes clock tree of an IC device by disabling portions of the clock tree, when clock signals for some circuits are not in use. Accordingly, circuit elements, including, for example, latches and/or flip-flops that are associated with the disabled portions of the clock tree, do not switch between logic high states and logic low states. Explained in a different way, the circuit elements, including, for example, latches and/or flip-flops, are prevented from toggling between different logic states. As a result, dynamic power consumption, caused by the circuit elements toggling between different logic states, of the IC device, is reduced.

FIG. 1 is a schematic diagram of an internal clock gated cell 100 in accordance with some embodiments of the present disclosure. As illustratively shown in FIG. 1, the internal clock gated cell 100 includes a latch control circuit 110, a latch 120 and a logic circuit 130.

The latch control circuit 110 is configured to receive a test enable signal TE and an enable signal ES, and generate a latch enable signal EB in response to the test enable signal TE and the enable signal ES. In some embodiments, the latch control circuit 110 includes a NOR gate 112. The NOR gate 112 has inputs receiving the test enable signal TE and the enable signal ES, and an output that is coupled to an input of the latch 120. The NOR gate 112 performs NOR operation for the test enable signal TE and the enable signal ES and outputs the latch enable signal EB.

The latch 120 is configured to receive the latch enable signal EB and an input clock signal CP, and generate a gating control signal Q in response to the latch enable signal EB and the input clock signal CP. In some embodiments, the latch 120 is implemented by a set-reset (SR) latch. Various types of latches to implement the latch 120 are within the contemplated scope of the present disclosure.

The logic circuit 130 is configured to receive the input clock signal CP and the gating control signal Q, and generate an output clock signal CPQ in response to the gating control signal Q and the input clock signal CP. For illustration of operation, the logic circuit 130 selectively passes the input clock signal CP as the output clock signal CPQ in response to the gating control signal Q.

In some embodiments, the logic circuit 130 includes a NAND gate 132 and an inverter 134. For illustration, the NAND gate 132 has an input receiving the input clock signal CP, and another input coupled to an output of the latch 120 and receiving the gating control signal Q. The inverter 134 has an input coupled to an output of the NAND gate 132, and an output for outputting the output clock signal CPQ. In operation, the NAND gate 132 performs NAND operation for the input clock signal CP and the gating control signal Q. Then, the inverter 134 performs logical inversion operation for signal from the output of the NAND gate 132, and accordingly outputs the output clock signal CPQ.

The configurations of the latch control circuit 110 and the logic circuit 130 are given for illustration. Various logic gates to implement the latch control circuit 110 and the logic circuit 130 are within the contemplated scope of the present disclosure.

Figure 2:
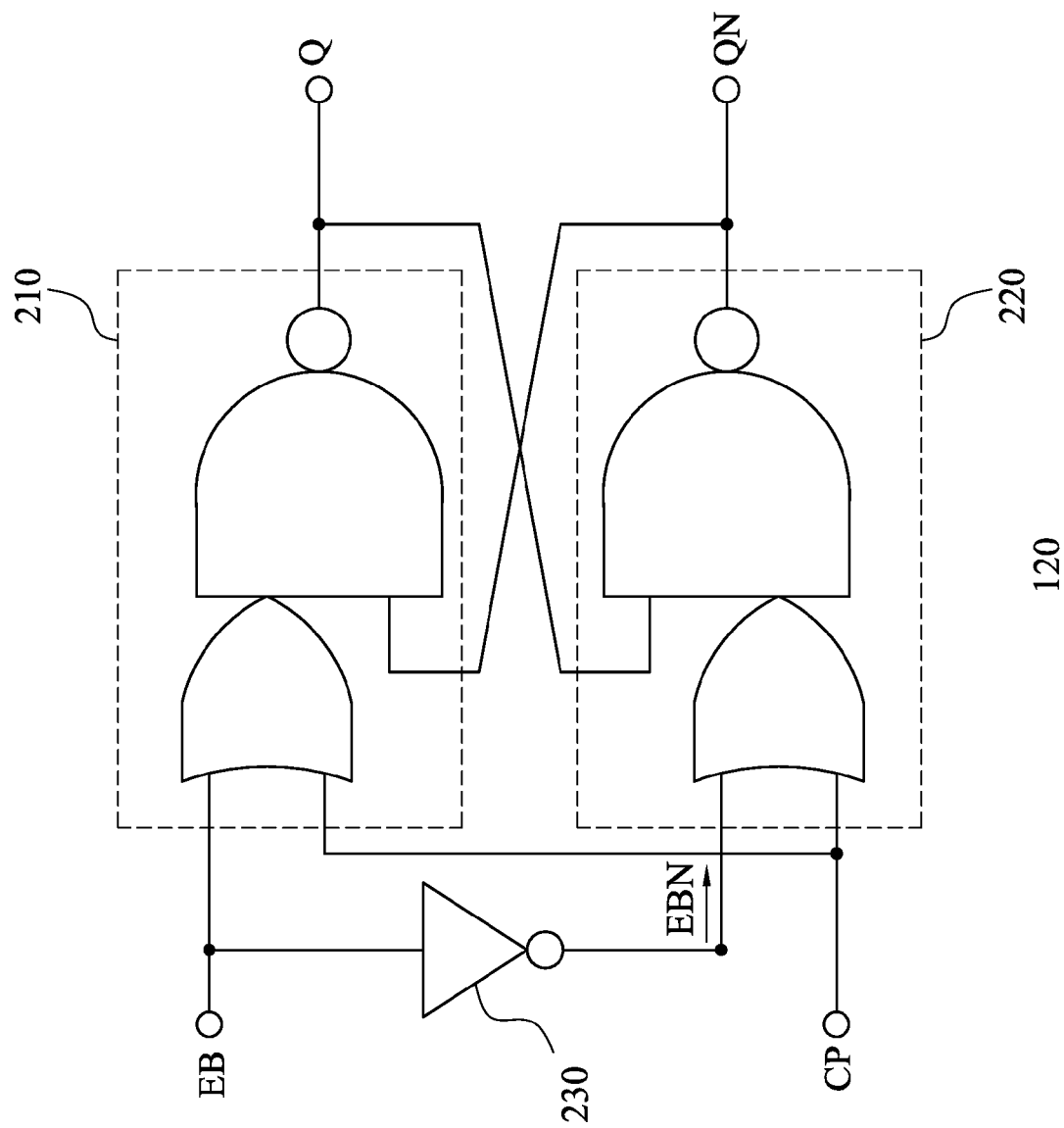
FIG. 2 is a circuit diagram of the latch in FIG. 1, in accordance with some embodiments of the present disclosure.

FIG. 2 is a circuit diagram of the latch 120 in FIG. 1, in accordance with some embodiments of the present disclosure. For illustration in FIG. 2, the latch 120 is an SR latch, and includes a pair of logic gates, which, in some embodiments, are compound logic gates, each of which is configured to perform multi-level compound logic function. In some embodiments, the compound logic gates are OR-AND-Invert (OAI) logic gates 210 and 220, as illustrated in FIG. 2. Typically, OAI logic gate performs a two-level compound (or complex) logic functions constructed from the combination of one or more OR gates followed by a NAND gate.

For illustration in FIG. 2, the OAI logic gates 210 and 220 are cross coupled with each other. The OAI logic gate 210 includes three inputs. One input of an OR gate of the OAI logic gate 210 is coupled to the output of latch control circuit 110 in FIG. 1, to receive the latch enable signal EB. The other input of the OR gate of the OAI logic gate 210 is configured to receive the input clock signal CP. An input of a NAND gate of the OAI logic gate 210 is coupled to an output of the OAI logic gate 220, to receive an output signal QN from the OAI logic gate 220.

Moreover, the OAI logic gate 220 includes three inputs. One input of an OR gate of the OAI logic gate 220 is coupled to an output of an inverter 230, to receive a logical complement of the latch enable signal EB, which is signal EBN, from the inverter 230. The other input of the OR gate of the OAI logic gate 220 is configured to receive the input clock signal CP. An input of a NAND gate of the OAI logic gate 220 is coupled to an output of the OAI logic gate 210, to receive an output signal from the OAI logic gate 210. The output of the OAI logic gate 210 is further coupled to the logic circuit 130 in FIG. 1, to output the gating control signal Q to the logic circuit 130 in FIG. 1.

For illustration of operation, when the input clock signal CP and the latch enable signal EB are both at logic low level, the output of the OR gate of the OAI logic gate 210 is at logic low level and inputted to the NAND gate of the OAI logic gate 210. Moreover, the output of the OR gate of the OAI logic gate 220 is at high low level and inputted to the NAND gate of the OAI logic gate 220. With one input being at logic low level, the NAND gate of the OAI logic gate 210 outputs the gating control signal Q that is at logic high level.

When the input clock signal CP transitions to logic high level and the latch enable signal EB remains at logic low level, the output of the OR gate of the OAI logic gate 210 is at logic high level and inputted to the NAND gate of the OAI logic gate 210. Moreover, the output of the OR gate of the OAI logic gate 220 remains at high low level. In such a condition, no change is made to the inputs of the NAND gate of the OAI logic gate 210 and the inputs of the NAND gate of the OAI logic gate 210. Accordingly, the gating control signal Q remains at logic high level.

Afterwards, when the input clock signal CP transitions from logic high level to logic low level and the latch enable signal EB transitions from logic low level to logic high level, the output of the OR gate of the OAI logic gate 210 is at logic high level and inputted to the NAND gate of the OAI logic gate 210. Moreover, the output of the OR gate of the OAI logic gate 220 is at logic low level and inputted to the NAND gate of the OAI logic gate 220. With one input being at logic low level, the NAND gate of the OAI logic gate 220, the NAND gate of the OAI logic gate 220 outputs the signal QN that is at logic high level. With receiving the output of logic high level from the OR gate of the OAI logic gate 210 and the signal QN being at logic high level, the NAND gate of the OAI logic gate 210 outputs the gating control signal Q that is at logic low level.

Then, when the input clock signal CP transitions from logic low level to logic high level and the latch enable signal EB remains at logic high level, the output of the OR gate of the OAI logic gate 210 remains at logic high level. Moreover, the output of the OR gate of the OAI logic gate 220 is at logic high level. In such a condition, no change is made to the output of the NAND gate of the OAI logic gate 210 and the output of the NAND gate of the OAI logic gate 210. Accordingly, the gating control signal Q remains at logic low level.

The above illustrations include exemplary operations in sequence, but the operations are not necessarily performed in the order shown. Various orders of the operations of the latch 120 in FIG. 2 are within the contemplated scope of the present disclosure. Moreover, operations may be added, replaced, changed order, and/or eliminated as appropriate, in accordance with the spirit and scope of various embodiments of the present disclosure.

Figure 3:
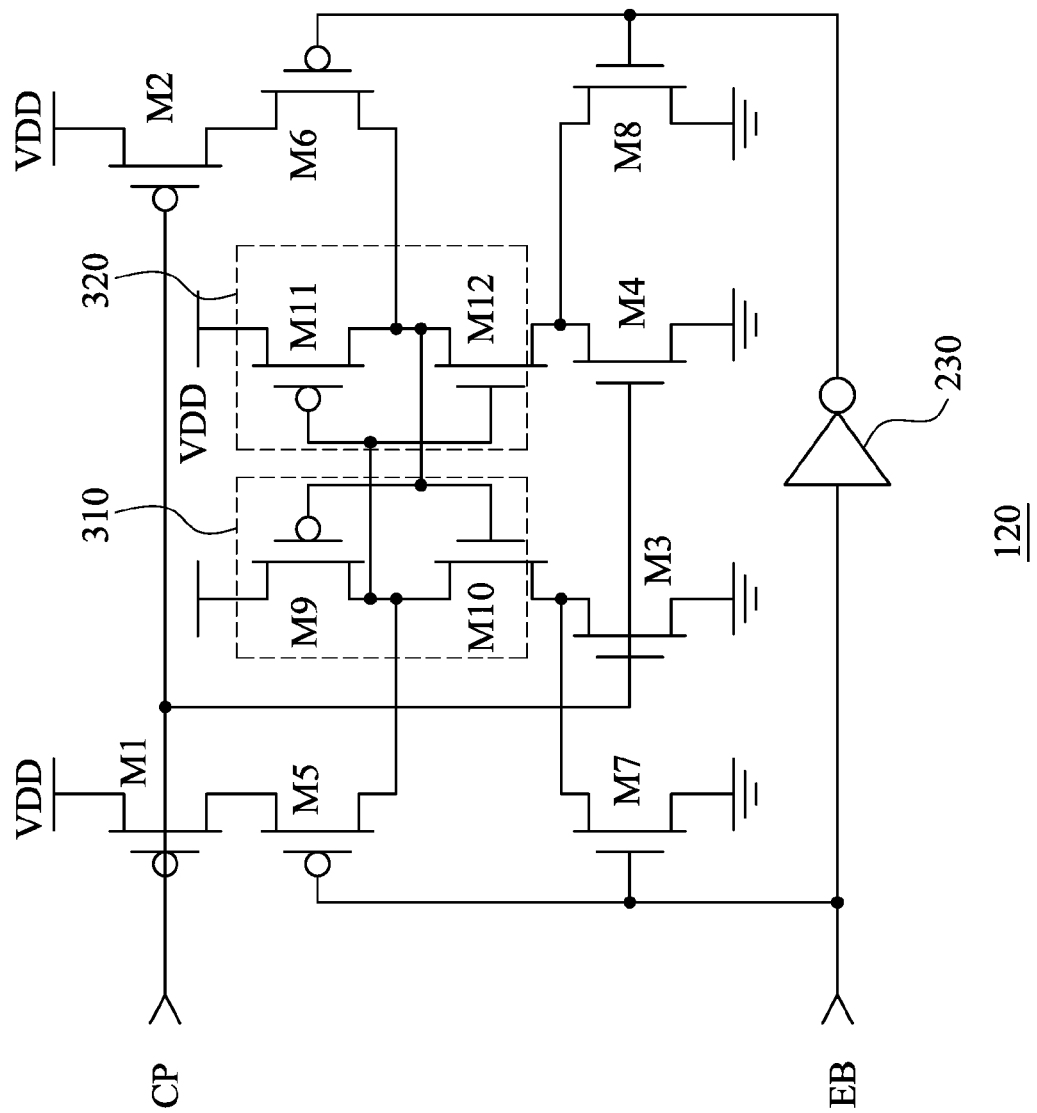
FIG. 3 is a detailed circuit diagram of the latch illustrated in FIG. 2, in accordance with some embodiments of the present disclosure.

FIG. 3 is a detailed circuit diagram of the latch 120 illustrated in FIG. 2, in accordance with some embodiments of the present disclosure. As illustratively shown in FIG. 3, two header switches, which, in some embodiments, are PMOS transistors M1 and M2, have gates configured to receive the input clock signal CP. Sources of the transistors M1 and M2 are coupled to a voltage supply, which, in some embodiments, is VDD. Two footer switches, which, in some embodiments, are NMOS transistors M3 and M4, also have gates configured to receive the input clock signal CP. Sources of the transistors M3 and M4 are coupled to another voltage supply, which, in some embodiments, is ground. In such a configuration, the transistors M1, M2, M3, and M4 are controlled with the input clock signal CP, to operatively turn on and turn off.

Moreover, a pair of switches, which, in some embodiments, are PMOS transistors M5 and M6 shown in FIG. 3, are coupled in series with the transistors M1 and M2, respectively. A pair of switches, which, in some embodiments, are NMOS transistors M7 and M8 shown in FIG. 3, are coupled in parallel with the transistors M3 and M4, respectively.

For illustration, the source of the transistor M5 is coupled to the drain of the transistor M1, and the gate of the transistor M5 is configured to receive the latch enable signal EB. The source of the transistor M6 is coupled to the drain of the transistor M2, and the gate of the transistor M6 is coupled to the output of the inverter 230 and receives the logical complement of the latch enable signal EB. The gate of the transistor M7 is configured to receive the latch enable signal EB, the drain of the transistor M7 is coupled to the drain of the transistor M3, and the source of the transistor M7 is coupled to, for example, ground. The gate of the transistor M8 is configured to receive the logical complement of the latch enable signal EB, the drain of the transistor M8 is coupled to the drain of the transistor M4, and the source of the transistor M8 is coupled to, for example, ground. In such a configuration, the transistors M5 and M7 are controlled with the latch enable signal EB, and the transistors M6 and M8 are controlled with the logical complement of the latch enable signal EB, to operatively turn on and turn off.

Furthermore, a pair of cross-coupled inverters 310 and 320 are coupled between the transistors M5 and M6. For illustration, the inverter 310 includes a pair of switches, which, in some embodiments, are PMOS transistor M9 and NMOS transistor M10. Additionally, the inverter 320 includes a pair of switches, which, in some embodiments, are PMOS transistor M11 and NMOS transistor M12. The gates of the transistors M9 and M10 are coupled together to the drains of the transistors M11 and M12, which are coupled to the drain of the transistor M6. The gates of the transistors M11 and M12 are coupled together to the drains of the transistors M9 and M10, which are coupled to the drain of the transistor M5. The sources of the transistors M9 and M11 are coupled to, for example, VDD. The source of the transistor M10 is coupled to the drains of the transistors M3 and M7. The source of the transistor M12 is coupled to the drains of the transistors M4 and M8. In such a configuration, the output of the inverter 310 is configured as the input of the inverter 320, and the output of the inverter 320 is configured as the input of the inverter 310.

In some embodiments of this document, at least one of the switches is implemented with at least one MOS transistor. In further embodiments, each one of the at least one MOS transistor is implemented with stacked MOS transistors or cascaded MOS transistors. In various embodiments, each one of the at least one MOS transistor is controlled with one or more control signals.

Moreover, the MOS transistors, for implementing the switches illustrated in this document, are given for illustrative purposes. Various types of transistors to implement the switches are within the contemplated scope of the present disclosure. For example, in various embodiments, bipolar junction transistor (BJT) is used to implement the switches illustrated in this document.

Figure 4:
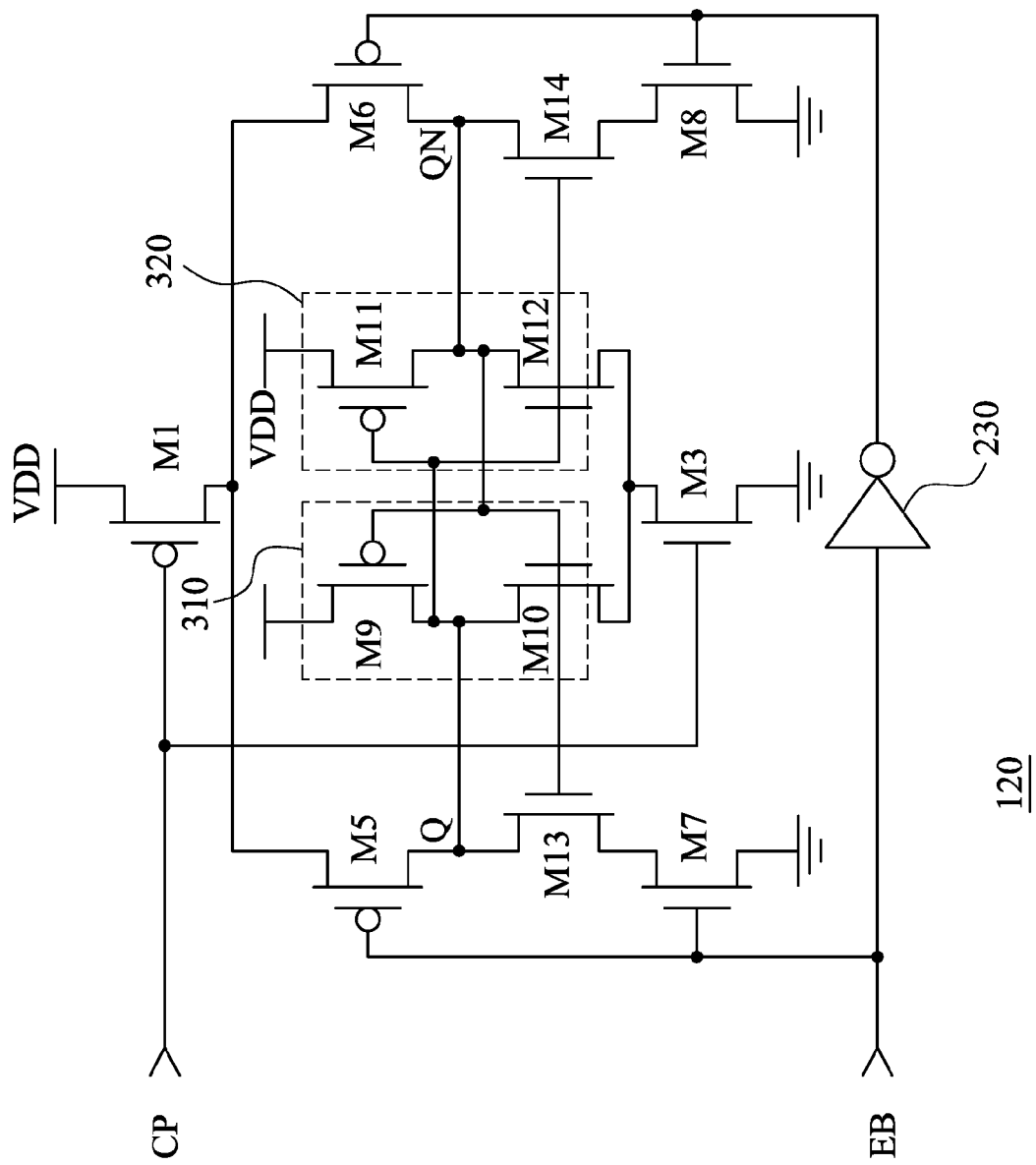
FIG. 4 is a detailed circuit diagram of the latch illustrated in FIG. 2, in accordance with various embodiments of the present disclosure.

FIG. 4 is a detailed circuit diagram of the latch 120 illustrated in FIG. 2, in accordance with various embodiments of the present disclosure. With respect to the embodiments of FIG. 3, like elements in FIG. 4 are designated with the same reference numbers for ease of understanding.

Compared to the embodiments illustrated in FIG. 3, the latch 120 in FIG. 4 includes the transistors M1 and M3 without the transistors M2 and M4. In such embodiments, the drain of the transistor M1 is coupled to the sources of the transistors M5 and M6, and the drain of the transistor M3 is coupled to the sources of the transistors M10 and M12.

Moreover, compared to the embodiments illustrated in FIG. 3, the latch 120 in FIG. 4 further includes a pair of switches, which, in some embodiments, are NMOS transistors M13 and M14. For illustration, the transistors M5, M13 and M7 are coupled in series with the transistor M1, and the transistors M6, M14 and M8 are coupled in series with the transistor M1.

For illustration in FIG. 4, the transistor M13 is coupled in series between the transistors M5 and M7. The drain of the transistor M13 is coupled to the drain of the transistor M5, and the source of the transistor M13 is coupled to the drain of the transistor M7. Furthermore, the transistor M14 is coupled in series between the transistors M6 and M8. The drain of the transistor M14 is coupled to the drain of the transistor M6, and the source of the transistor M14 is coupled to the drain of the transistor M8.

In addition, the gates of the transistors M13 and M14 are coupled to the outputs of the inverters 310 and 320, respectively. For illustration, the gates of the transistors M9, M10 and M13 are coupled together to the drains of the transistors M11 and M12. The gates of the transistors M11, M12 and M14 are coupled together to the drains of the transistors M9 and M10. In such configurations, the transistor M13 is controlled with the output of the inverter 320, which is illustrated as node QN in FIG. 4, and the transistor M14 is controlled with the output of the inverter 310, which is illustrated as node Q in FIG. 4.

The configuration of the latch 120 in FIG. 4 is given for illustrative purposes. Various configurations of the latch 120 in FIG. 4 are within the contemplated scope of the present disclosure. For example, in various embodiments, the latch 120 in FIG. 4 includes the transistors M1 and M3, and further includes the transistor M2 shown in FIG. 3. In still various embodiments, the latch 120 in FIG. 4 includes the transistors M1 and M3, and further includes the transistor M4 shown in FIG. 3. In alternative embodiments, the latch 120 in FIG. 4 includes the transistors M1 and M3, and further includes the transistors M2 and M4 shown in FIG. 3.

Figure 5:
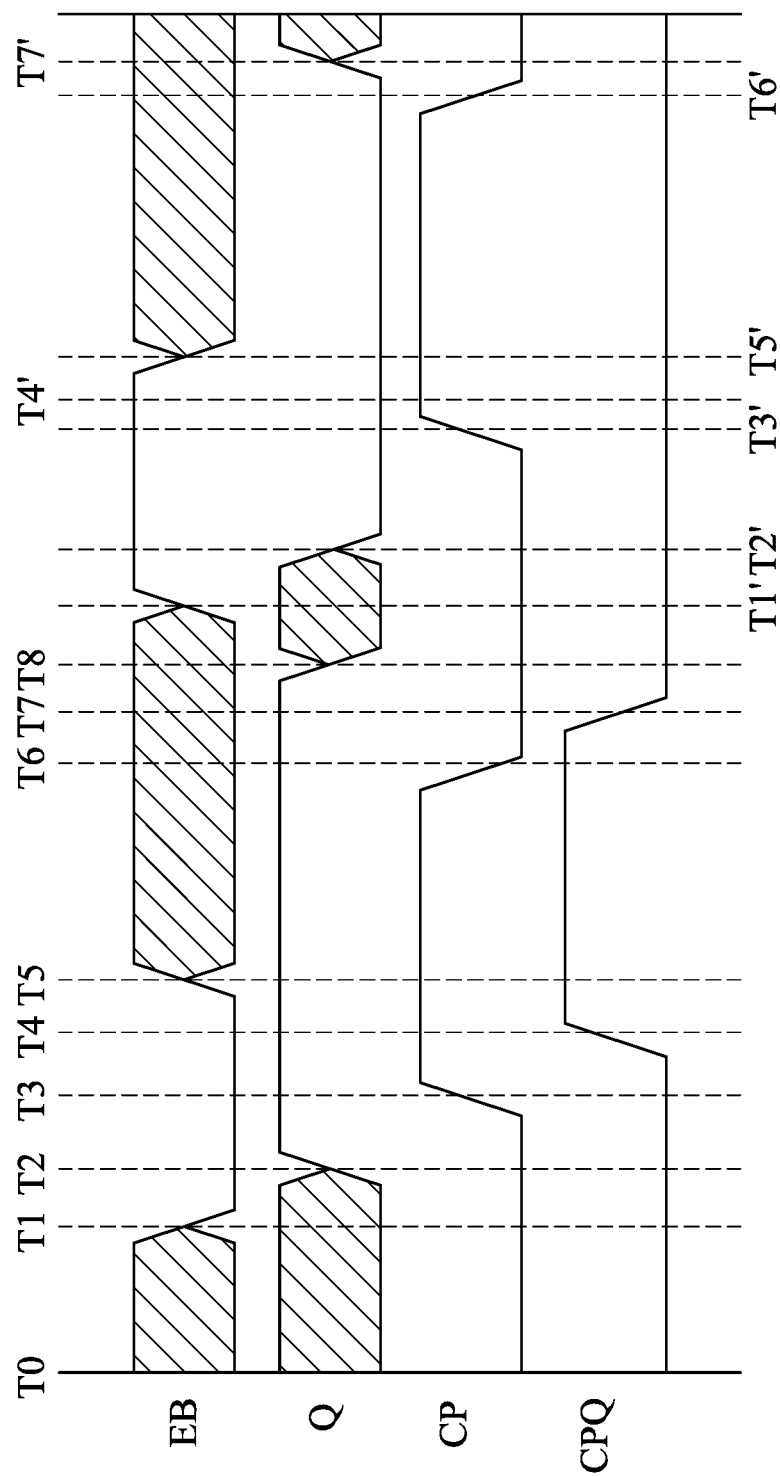
FIG. 5 is a timing diagram of various signals of the internal clock gated cell in FIG. 1, in accordance with some embodiments of the present disclosure.
Figure 6:
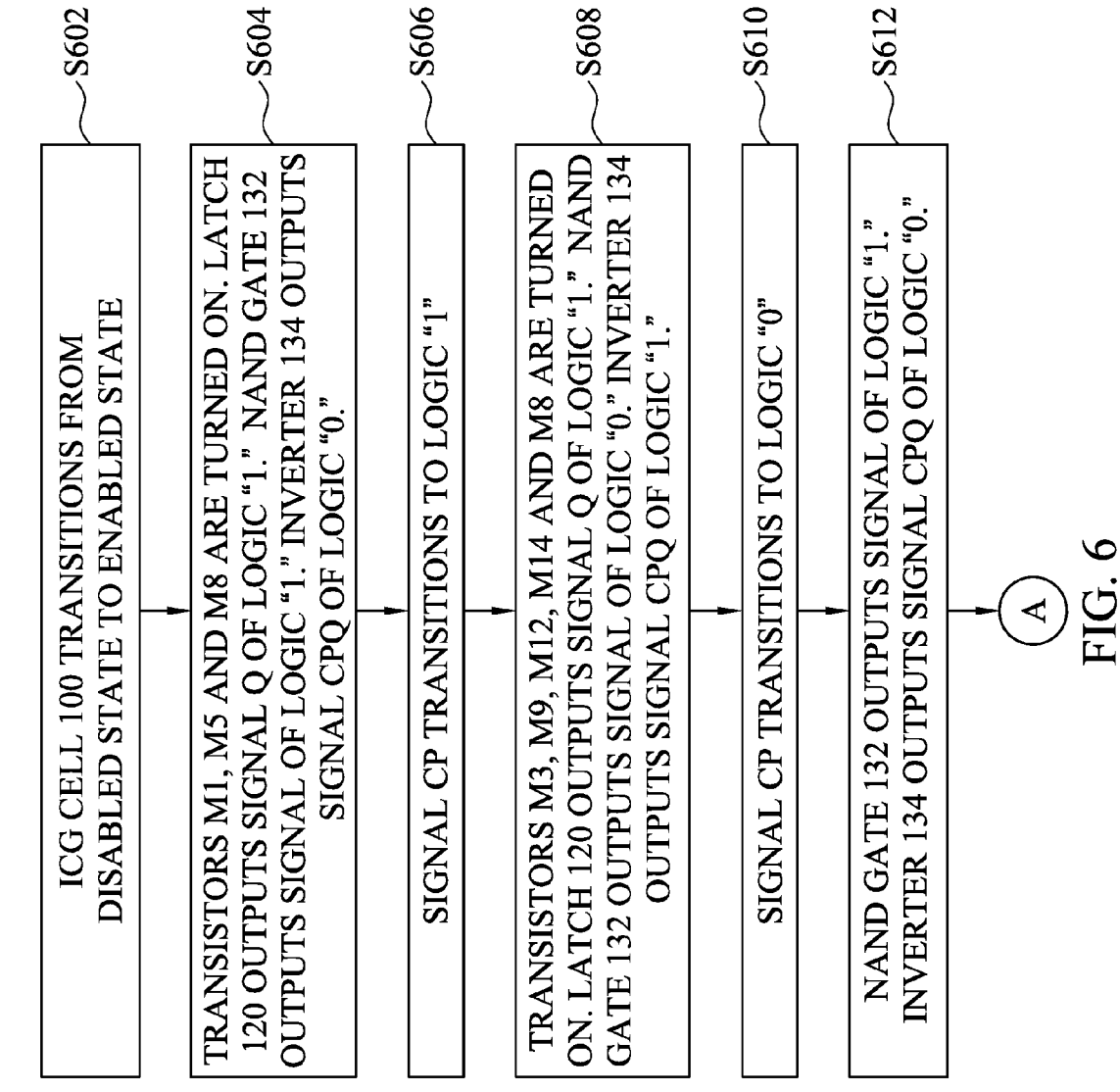
FIG. 6 and FIG. 7 are each a flow chart of a method illustrating operations of the internal clock gated cell in FIG. 1 and the latch in FIG. 4, in accordance with some embodiments of the present disclosure.
Figure 7:
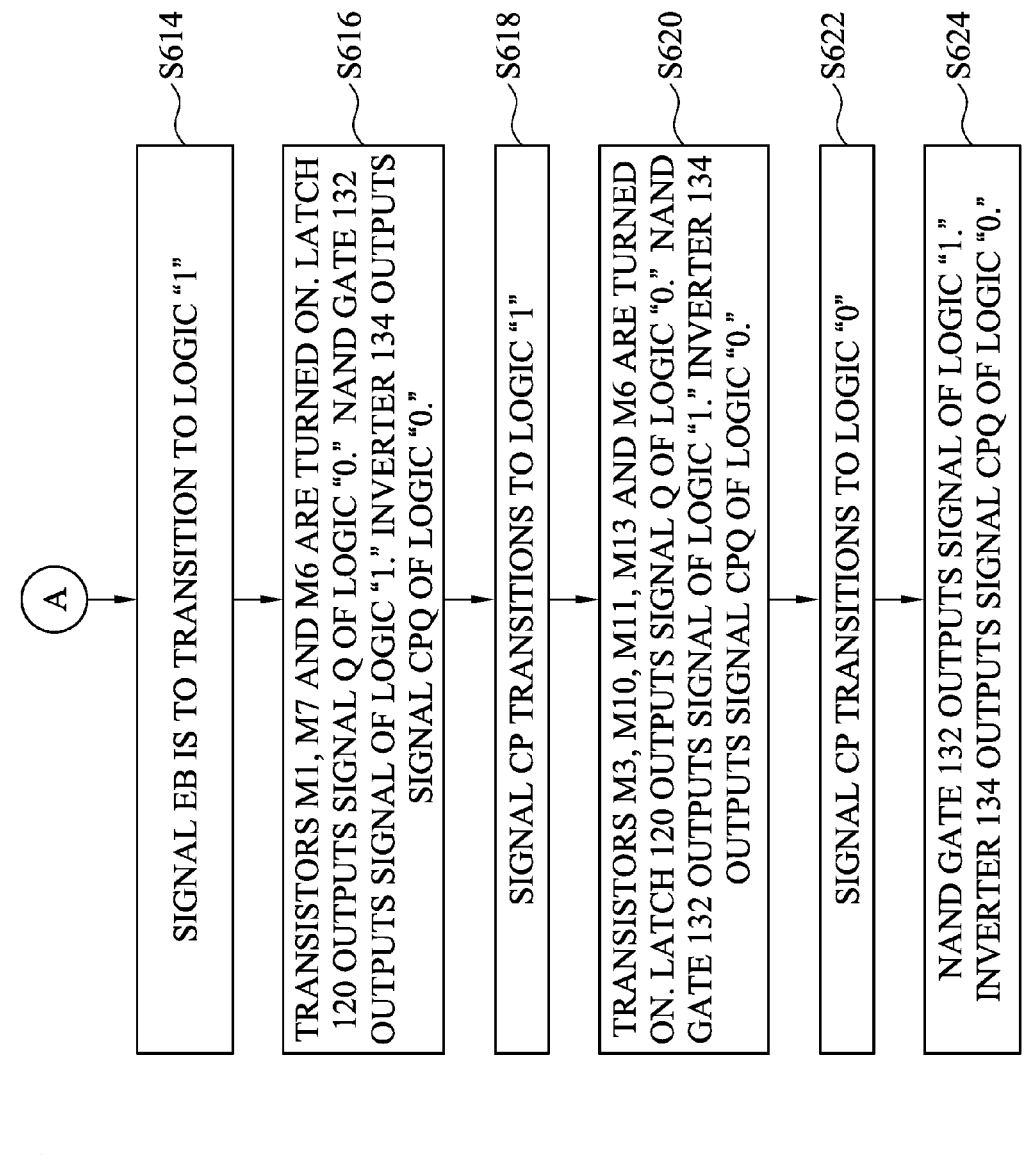

FIG. 5 is a timing diagram of various signals of the internal clock gated cell 100 in FIG. 1, in accordance with some embodiments of the present disclosure. FIG. 6 and FIG. 7 are each a flow chart of a method 600 illustrating operations of the internal clock gated cell 100 in FIG. 1 and the latch 120 in FIG. 4, in accordance with some embodiments of the present disclosure. The method 600 in FIG. 6 and FIG. 7 includes operations S602-S624 that will be described below for illustration with reference to FIG. 1, FIG. 4 and FIG. 5.

For simplicity of illustration, in following operations, logic high level or high voltage level of the signals and nodes is referred to as logic "1," and logic low level or low voltage level of the signals and nodes is referred to as logic "0."

Initially at time T0 in FIG. 5, the internal clock gated cell 100 in FIG. 1 is configured in the disabled state, in which the input clock signal CP and the output clock signal CPQ are both at logic "0." Between time T0 and time T1, the latch enable signal EB does not affect any other signals of the internal clock gated cell 100.

In operation S602, at time T1 in FIG. 5, the internal clock gated cell 100 transitions from the disabled state to an enabled state. For illustration in FIG. 5, the latch enable signal EB is presented to the internal clock gated cell 100 and to transition to logic "0" at time T1, to be stable for a setup time duration Tsu (not labeled). The setup time duration Tsu, in some embodiments, represents a minimum amount of time that the latch enable signal EB is valid before the input clock signal CP changes its logic state, for example, from logic "0" to logic "1."

Although the latch enable signal EB presented to the internal clock gated cell 100 is set to be stable at least for the setup time duration Tsu before the clock edge, it is not limited on the latch enable signal EB arriving at earlier times. Various timing configurations of presenting the latch enable signal EB are within the contemplated scope of the present disclosure.

At time T2 in FIG. 5, the latch enable signal EB is stable at logic "0" and the input clock signal CP is also at logic "0." In operation S604, for illustration in FIG. 4, the transistor M1 is turned on according to the input clock signal CP, and the transistor M5 is turned on according to the latch enable signal EB. The transistor M8 is turned on, by the inverter 230, according to the complement of the latch enable signal EB. With the transistors M1 and M5 both being turned on, the node Q (also indicating the gating control signal Q) in FIG. 4 is pulled up to VDD. Based on the node Q being pulled up to VDD, the transistor M14 is also turned on, which results in that the node QN (also indicating the output signal QN) in FIG. 4 is pulled down to ground.

With the node Q in FIG. 4 being pulled up to VDD, the gating control signal Q in FIG. 5 transitions to logic "1" at time T2. Alternatively stated, the latch 120 in FIG. 1 outputs the gating control signal Q of logic "1." With the input clock signal CP of logic "0" and the gating control signal Q of logic "1," the NAND gate 132 in FIG. 1 outputs the signal of logic "1." In response to the signal output from the NAND gate 132, the inverter 134 outputs the output clock signal CPQ of logic "0," as illustrated in FIG. 5.

In operation S606, at time T3 in FIG. 5, the input clock signal CP transitions from logic "0" to logic "1," and the latch enable signal EB remains at logic "0."

At time T4 in FIG. 5, the latch enable signal EB remains at logic "0" and the input clock signal CP is stable at logic "1." In operation S608, for illustration in FIG. 4, the transistor M3 is turned on according to the input clock signal CP. Moreover, with the node Q operated previously at logic "1" and the node QN operated previously at logic "0," the transistor M9 is turned on according to the node QN of logic "0" and the transistor M12 is turned on according to the node Q of logic "1." The transistor M14 is also turned on according to the node Q of logic "1." Additionally, the transistor M8 is turned on, by the inverter 230, according to the logical complement of the latch enable signal EB, which is at logic "0." Effectively, the node Q is latched at logic "1" and the node QN is latched at logic "0."

Based on the above, the gating control signal Q illustrated in FIG. 5 remains at logic "1" at time T4. With the input clock signal CP of logic "1" and the gating control signal Q of logic "1," the NAND gate 132 in FIG. 1 outputs the signal of logic "0." In response to the signal output from the NAND gate 132, the inverter 134 in FIG. 1 outputs the output clock signal CPQ which transitions to logic "1," as illustrated in FIG. 5.

At time T5 in FIG. 5, the input clock signal CP remains at logic "1," and the gating control signal Q is latched at logic "1." Accordingly, the output of the NAND gate 132 in FIG. 1 remains at logic "0," and the inverter 134 in FIG. 1 outputs the output clock signal CPQ which is stable at logic "1," as illustrated in FIG. 5.

With the gating control signal Q being latched at logic "1," the latch enable signal EB does not affect any other signals including the gating control signal Q and the output clock signal CPQ, of the internal clock gated cell 100. For illustration in FIG. 5, between time T5 and time T1', the latch enable signal EB is irrelevant to the operation of the latch 120.

In operation S610, at time T6 in FIG. 5, the input clock signal CP transitions from logic "1" to logic "0," in order to result in the change of the output clock signal CPQ at time T7.

At time T7 in FIG. 5, the input clock signal CP is stable at logic "0" and the gating control signal Q remains at logic "1." In operation S612, with the input clock signal CP of logic "0" and the gating control signal Q of logic "1," the NAND gate 132 in FIG. 1 outputs the signal of logic "1." In response to the signal output from the NAND gate 132, the inverter 134 in FIG. 1 outputs the output clock signal CPQ which transitions to logic "0," as illustrated in FIG. 5.

At time T8 in FIG. 5, the input clock signal CP remains at logic "0." The output clock signal CPQ is stable at logic "0" because of the operations at time T7. With the input clock signal CP of logic "0," the NAND gate 132 in FIG. 1 outputs the signal of logic "1," no matter at which logic the gating control signal Q is. Accordingly, the inverter 134 in FIG. 1 outputs the output clock signal CPQ of logic "0," as illustrated in FIG. 5, in which the gating control signal Q is irrelevant to the output clock signal CPQ. For illustration in FIG. 5, between time T8 and time T2', the gating control signal Q is irrelevant to the output clock signal CPQ.

In operation S614, at time T1' in FIG. 5, the input clock signal CP remains at logic "0," and the latch enable signal EB is to transition to logic "1," to be stable for the setup time duration Tsu as described above.

At time T2' in FIG. 5, the latch enable signal EB is stable at logic "1" and the input clock signal CP remains at logic "0." In operation S616, for illustration in FIG. 4, the transistor M1 is turned on according to the input clock signal CP, and the transistor M7 is turned on according to the latch enable signal EB. The transistor M6 is turned on, by the inverter 230, according to the complement of the latch enable signal EB. With the transistors M1 and M6 both being turned on, the node QN in FIG. 4 is pulled up to VDD. Based on the node QN being pulled up to VDD, the transistor M10 is also turned on, which results in that the node Q in FIG. 4 is pulled down to ground.

With the node Q in FIG. 4 being pulled down to ground, the gating control signal Q in FIG. 5 transitions to logic "0" at time T2'. Alternatively stated, the latch 120 in FIG. 1 outputs the gating control signal Q of logic "0." With the input clock signal CP of logic "0" and the gating control signal Q of logic "0," the NAND gate 132 in FIG. 1 outputs the signal of logic "1." In response to the signal output from the NAND gate 132, the inverter 134 outputs the output clock signal CPQ of logic "0," as illustrated in FIG. 5.

In operation S618, at time T3' in FIG. 5, the input clock signal CP transitions from logic "0" to logic "1," and the latch enable signal EB remains at logic "1."

At time T4' in FIG. 5, the latch enable signal EB remains at logic "1" and the input clock signal CP is stable at logic "1." In operation S620, for illustration in FIG. 4, the transistor M3 is turned on according to the input clock signal CP. Moreover, with the node Q operated previously at logic "0" and the node QN operated previously at logic "1," the transistor M10 is turned on according to the node QN of logic "1" and the transistor M11 is turned on according to the node Q of logic "0." The transistor M13 is also turned on according to the node QN of logic "1." Additionally, the transistor M6 is turned on, by the inverter 230, according to the logical complement of the latch enable signal EB, which is at logic "0." Effectively, the node Q is latched at logic "0" and the node QN is latched at logic "1."

Based on the above, the gating control signal Q illustrated in FIG. 5 remains at logic "0" at time T4'. With the input clock signal CP of logic "1" and the gating control signal Q of logic "0," the NAND gate 132 in FIG. 1 outputs the signal of logic "1." In response to the signal output from the NAND gate 132, the inverter 134 in FIG. 1 outputs the output clock signal CPQ which transitions to logic "0," as illustrated in FIG. 5.

At time T5' in FIG. 5, the input clock signal CP remains at logic "1," and the gating control signal Q is latched at logic "0." Accordingly, the output of the NAND gate 132 in FIG. 1 remains at logic "1," and the inverter 134 in FIG. 1 outputs the output clock signal CPQ which is stable at logic "0," as illustrated in FIG. 5.

With the gating control signal Q being latched at logic "0," the latch enable signal EB does not affect any other signals including the gating control signal Q and the output clock signal CPQ, of the internal clock gated cell 100. For illustration in FIG. 5, between time T5' and time T7', the latch enable signal EB is irrelevant to the operation of the latch 120.

In operation S622, at time T6' in FIG. 5, the input clock signal CP transitions from logic "1" to logic "0."

At time T7' in FIG. 5, the input clock signal CP remains at logic "0" and the gating control signal Q remains at logic "0." In operation S612, with the input clock signal CP of logic "0" and the gating control signal Q of logic "0," the NAND gate 132 in FIG. 1 outputs the signal of logic "1." In response to the signal output from the NAND gate 132, the inverter 134 in FIG. 1 outputs the output clock signal CPQ which transitions to logic "0," as illustrated in FIG. 5.

As described above, there are only a few transistors that are toggled or change state in response to the input clock signal CP. For illustration in FIG. 1 and FIG. 4, when the enable signal ES is at logic "0," the transistors M1 and M3 in FIG. 4 and two transistors of the NAND gate 132 in FIG. 1 are toggled in response to the input clock signal CP. With the reduced amount of devices that are toggled when the enable signal ES is at logic "0," the power consumption of the internal clock gated cell 100 is reduced accordingly.

In addition, based on the configurations and operations of the latch 120 illustrated above, the latch 120 is able to operatively pass and latch the signal by employing, for example, the rising or the falling edge of the input clock signal CP. Explained in a different way, the latch 120 is able to operatively pass and latch the signal with one phase of the input clock signal CP.

Compared to some approaches using a latch which has internal clock inverter for the latch to operate with two phases of clock signal, internal clock inverter is unnecessary in the latch 120 illustrated in this document. Without the internal clock inverter used in the related approaches, power consumption of the latch 120 is able to be reduced, and the operation speed of the latch 120 is able to be improved.

The above illustrations include exemplary operations in sequence, but the operations are not necessarily performed in the order shown. Various orders of the operations illustrated in FIG. 6 and FIG. 7 are within the contemplated scope of the present disclosure. Moreover, operations may be added, replaced, changed order, and/or eliminated as appropriate, in accordance with the spirit and scope of various embodiments of the present disclosure.

Figure 8:
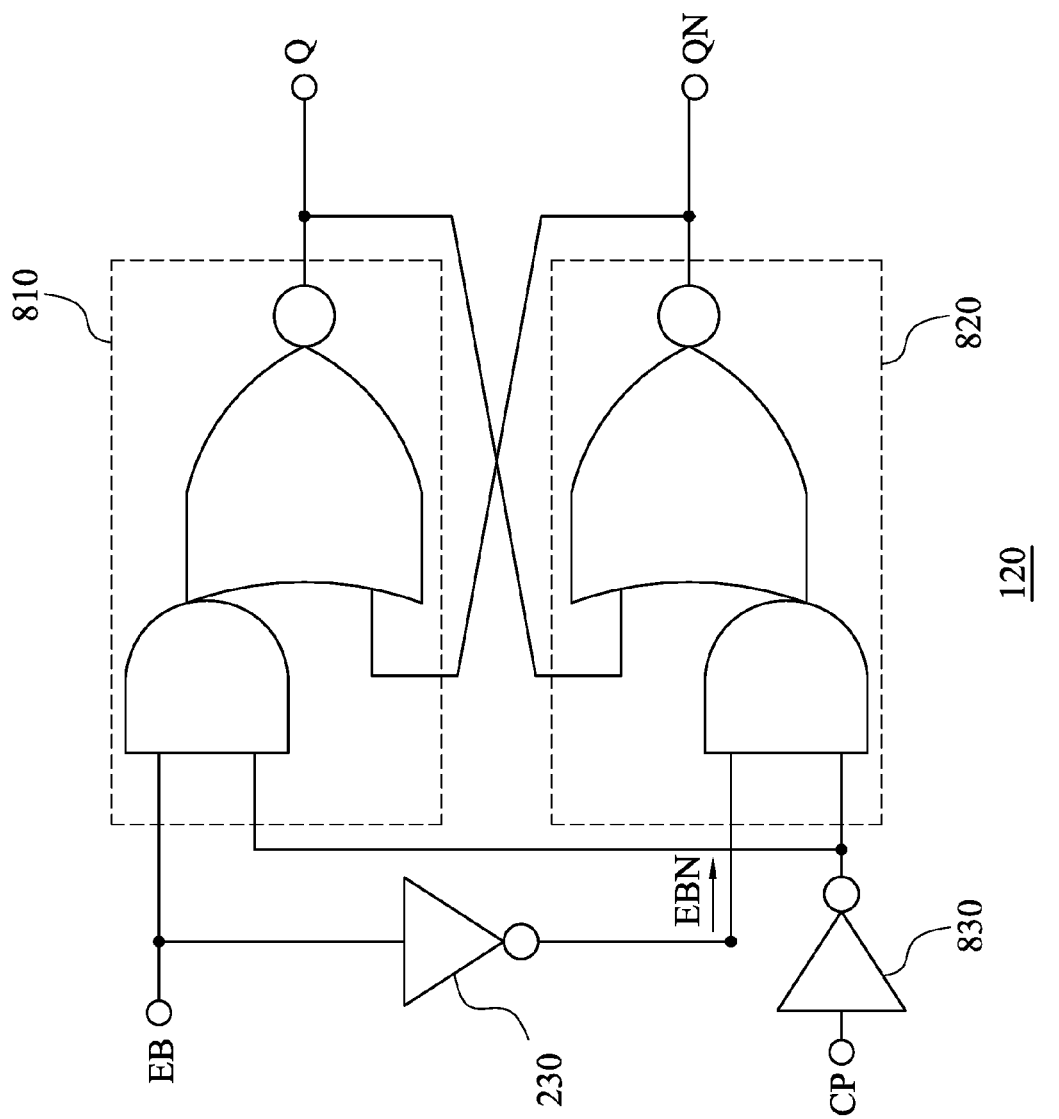
FIG. 8 is a circuit diagram of the latch in FIG. 1, in accordance with various embodiments of the present disclosure.

FIG. 8 is a circuit diagram of the latch 120 in FIG. 1, in accordance with various embodiments of the present disclosure. For illustration in FIG. 8, the latch 120 is an SR latch. Compared to the embodiments in FIG. 2, the latch 120 in FIG. 8 includes a pair of logic gates, which, in some embodiments, are compound logic gates, each of which is configured to perform multi-level compound logic function. In some embodiments, the logic gates are AND-OR-Invert (AOI) logic gates 810 and 820, as illustrated in FIG. 8. Typically, AOI logic gate performs a two-level complex (or compound) logic functions constructed from the combination of one or more AND gates followed by a NOR gate.

For illustration in FIG. 8, the AOI logic gates 810 and 820 are cross coupled with each other. The AOI logic gate 810 includes three inputs. One input of an AND gate of the AOI logic gate 810 is coupled to the output of latch control circuit 110 in FIG. 1, to receive the latch enable signal EB. The other input of the AND gate of the AOI logic gate 810 is configured to receive a logical complement of the input clock signal CP, from an inverter 830. An input of a NOR gate of the AOI logic gate 810 is coupled to an output of the AOI logic gate 820, to receive an output signal QN from the AOI logic gate 820.

Moreover, the AOI logic gate 820 includes three inputs. One input of an AND gate of the AOI logic gate 820 is coupled to the output of the inverter 230, to receive the logical complement of the latch enable signal EB, which is signal EBN, from the inverter 230. The other input of the AND gate of the AOI logic gate 820 is configured to receive the logical complement of the input clock signal CP. An input of a NOR gate of the AOI logic gate 820 is coupled to an output of the AOI logic gate 810, to receive an output signal from the AOI logic gate 810. The output of the AOI logic gate 810 is further coupled to the logic circuit 130 in FIG. 1, to output the gating control signal Q to the logic circuit 130 in FIG. 1.

The configurations of the logic gates illustrated in FIG. 2 and FIG. 8 are given for illustration. Various logic gates to implement the latch 120 are within the contemplated scope of the present disclosure.

Figure 9:
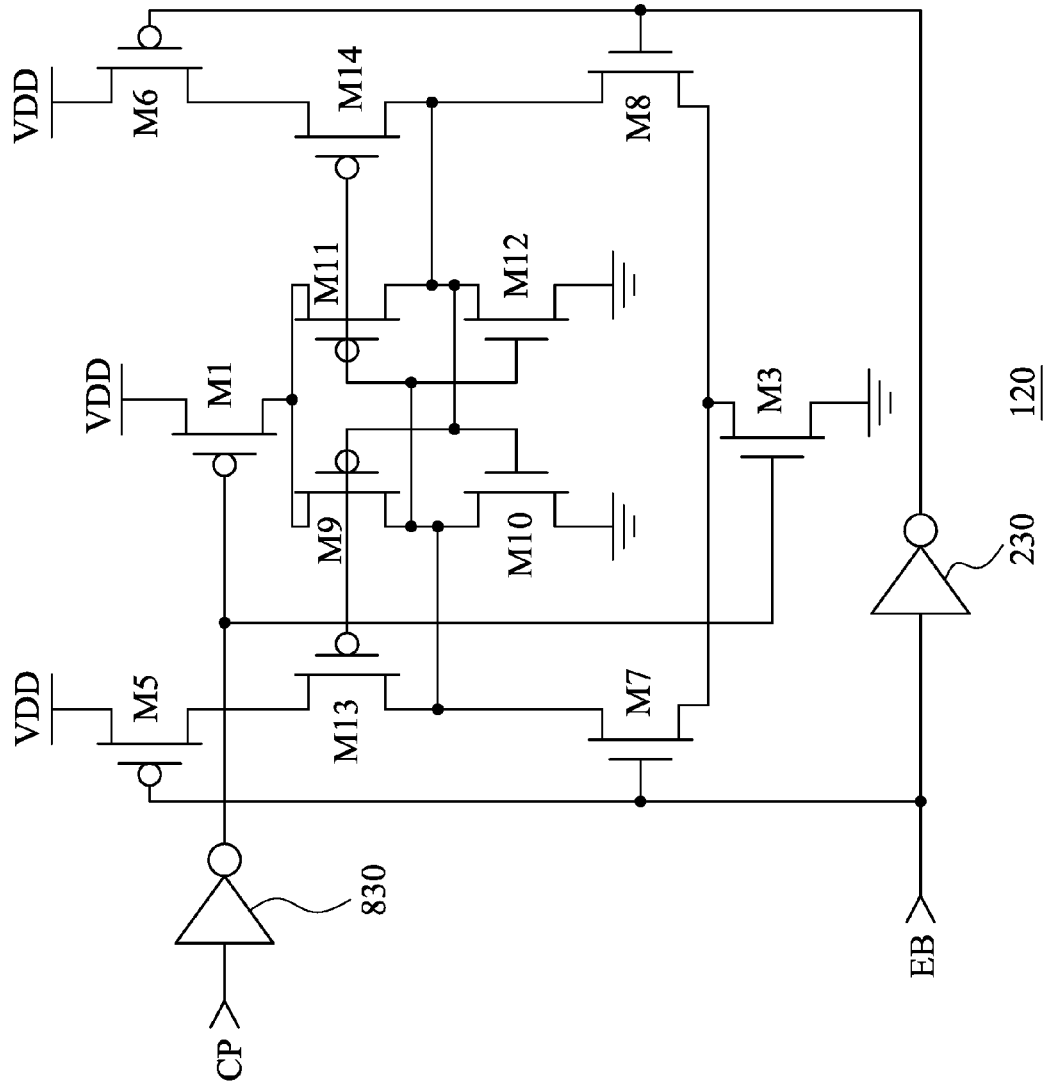
FIG. 9 is a detailed circuit diagram of the latch in FIG. 8, in accordance with some embodiments of the present disclosure.

FIG. 9 is a detailed circuit diagram of the latch 120 in FIG. 8, in accordance with some embodiments of the present disclosure. With respect to the embodiments of FIG. 4, like elements in FIG. 9 are designated with the same reference numbers for ease of understanding. Compared to FIG. 4, as illustratively shown in FIG. 9, the gates of the transistors M1 and M3 are coupled to the output of the inverter 830 receiving the input clock signal CP. Moreover, compared to FIG. 4, the sources of the transistors M5 and M6 are coupled to, for example, VDD. Additionally, compared to FIG. 4, the transistors M13 and M14, in the embodiments illustrated in FIG. 9, are PMOS transistors. The transistor M13 is coupled in series between the transistors M5 and M7, with its source coupled to the drain of the transistor M5 and its drain coupled to the drain of the transistor M7. The transistor M14 is coupled in series between the transistors M6 and M8, with its source coupled to the drain of the transistor M6 and its drain coupled to the drain of the transistor M8.

In this document, the term "coupled" may also be termed as "electrically coupled", and the term "connected" may be termed as "electrically connected". "Coupled" and "connected" may also be used to indicate that two or more elements cooperate or interact with each other.

In some embodiments, a circuit is disclosed that includes a latch and a logic circuit. The latch is configured to generate a gating control signal in response to a latch enable signal and an input clock signal. The latch includes a pair of logic gates each configured to perform multi-level compound logic function. The logic circuit is configured to receive the gating control signal and the input clock signal, and generate an output clock signal in response to the gating control signal and the input clock signal.

Also disclosed is a circuit that includes a latch control circuit, a latch and a logic circuit. The latch control circuit is configured to generate a latch enable signal in response to a test enable signal and an enable signal. The latch is configured to generate a gating control signal in response to the latch enable signal and an input clock signal. The latch includes a pair of logic gates each configured to perform multi-level compound logic function. The logic circuit is configured to selectively pass the input clock signal as an output clock signal in response to the gating control signal.

Also disclosed is a method that includes operations outlined below. In response to an input clock signal and a latch enable signal, generating, by a latch, a gating control signal, wherein the latch comprises a pair of logic gates each configured to perform multi-level compound logic function. In response to the gating control signal, selectively pass, by a logic circuit, the input clock signal as an output clock signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
    a latch configured to receive a latch enable signal and an input clock signal, and to generate a gating control signal in response to the latch enable signal and the received input clock signal, wherein the latch comprises a pair of logic gates, and each one of the logic gates is configured to perform multi-level compound logic function; and
    a logic circuit configured to receive the gating control signal and the input clock signal, and generate an output clock signal in response to the gating control signal and the received input clock signal,
    wherein the logic gates comprise:
        at least one header switch and at least one footer switch each configured to be controlled according to the received input clock signal;
        a first, a second, and a third switches coupled in series with the at least one header switch;
        a fourth, a fifth, and a sixth switches coupled in series with the at least one header switch; and
        a pair of cross-coupled inverters coupled to the at least one footer switch, wherein the second and the fifth switches are configured to be controlled with outputs of the inverters;
        wherein the first and the third switches are configured to be controlled with the latch enable signal, and the fourth and the sixth switches are configured to be controlled with a logical complement of the latch enable signal.

2. The circuit of claim 1, wherein the at least one header switch, the at least one footer switch, the first, the second, the third, the fourth, the fifth, and the sixth switches, and the pair of cross-coupled inverters are configured to operate as:
    a pair of OR-AND-Invert (OAI) logic gates.

3. The circuit of claim 1, wherein the at least one header switch, the at least one footer switch, the first, the second, the third, the fourth, the fifth, and the sixth switches, and the pair of cross-coupled inverters are configured to operate as two OR-AND-Invert (OAI) logic gates which are cross coupled with each other;

wherein one of the OAI logic gates is configured to receive the input clock signal and the latch enable signal and to output the gating control signal, and
    the other of the OAI logic gates is configured to receive the input clock signal and a logical complement of the latch enable signal.

4. The circuit of claim 1,
    wherein the at least one header switch and the at least one footer switch are further configured to be controlled with a logical complement of the received input clock signal.

5. The circuit of claim 4, wherein the at least one header switch, the at least one footer switch, the first, the second, the third, the fourth, the fifth, and the sixth switches, and the pair of cross-coupled inverters are configured to operate as a pair of AND-OR-Invert (AOI) logic gates.

6. The circuit of claim 4, wherein the at least one header switch, the at least one footer switch, the first, the second, the third, the fourth, the fifth, and the sixth switches, and the pair of cross-coupled inverters are configured to operate as two AND-OR-Invert (AOI) logic gates which are cross coupled with each other,
    wherein one of the AOI logic gates is configured to receive the latch enable signal and a logical complement of the input clock signal, and to output the gating control signal, and
    the other of the AOI logic gates is configured to receive a logical complement of the latch enable signal and the logical complement of the received input clock signal.

7. The circuit of claim 1, wherein the logic circuit comprises:
    a NAND gate having inputs configured to receive the gating control signal and the input clock signal; and
    an inverter having an input coupled to an output of the NAND gate, and an output configured to output the output clock signal.

8. The circuit of claim 1, further comprising:
    a latch control circuit configured to generate the latch enable signal in response to a test enable signal and an enable signal.

9. A circuit comprising:
    a latch control circuit configured to generate a latch enable signal in response to a test enable signal and an enable signal;
    a latch configured to receive the latch enable signal and an input clock signal, and to generate a gating control signal in response to the latch enable signal and the received input clock signal, wherein the latch comprises a pair of logic gates, and each one of the logic gates is configured to perform multi-level compound logic function; and
    a logic circuit configured to receive the input clock signal and to selectively pass the received input clock signal as an output clock signal in response to the gating control signal,
    wherein the logic gates comprise:
        a first, a second, and a third switches coupled in series with at least one footer switch which is configured to be controlled according to a logical complement of the received input clock signal;
        a fourth, a fifth, and a sixth switches coupled in series with the at least one footer switch; and
        a pair of cross-coupled inverters coupled to at least one header switch, wherein the second and the fifth switches are configured to be controlled with outputs of the inverters, wherein the first and the third switches are configured to be controlled with the latch enable signal, and the fourth and the sixth switches are configured to be controlled with a logical complement of the latch enable signal.

10. The circuit of claim 9, wherein the at least one header switch, the at least one footer switch, the first, the second, the third, the fourth, the fifth, and the sixth switches, and the pair of cross-coupled inverters are configured to operate as AND-OR-Invert (AOI) logic gates.

11. The circuit of claim 9, wherein one of the logic gates is configured to receive the latch enable signal and a logical complement of the input clock signal, and to output the gating control signal, and the other of the logic gates is configured to receive the logical complement of the latch enable signal and the logical complement of the input clock signal.

12. The circuit of claim 9, wherein the at least one header switch and the at least one footer switch are further configured to be controlled with the received input clock signal.

13. The circuit of claim 12, wherein the at least one header switch, the at least one footer switch, the first, the second, the third, the fourth, the fifth, and the sixth switches, and the pair of cross-coupled inverters are configured to operate as OR-AND-Invert (OAI) logic gates.

14. The circuit of claim 12, wherein one of the logic gates is configured to receive the input clock signal and the latch enable signal and to output the gating control signal, and the other of the logic gates is configured to receive the input clock signal and the logical complement of the latch enable signal.

15. The circuit of claim 9, wherein the latch control circuit comprises an NOR gate having inputs configured to receive the test enable signal and the enable signal.

16. The circuit of claim 9, wherein the logic circuit comprises:

a NAND gate having inputs configured to receive the gating control signal and the input clock signal; and an inverter having an input coupled to an output of the NAND gate, and an output configured to output the output clock signal.

17. A method comprising:

receiving an input clock signal and a latch enable signal and generating, by a latch, a gating control signal in response to the received input clock signal and the latch enable signal, wherein the latch comprises a pair of logic gates, and each one of the logic gates is configured to perform multi-level compound logic function; and receiving the input clock signal and selectively passing, by a logic circuit, the received input clock signal as an output clock signal in response to the gating control signal, wherein the logic gates comprise:

at least one header switch and at least one footer switch each configured to be controlled according to the received input clock signal;

a first, a second, and a third switches coupled in series with the at least one header switch;

a fourth, a fifth, and a sixth switches coupled in series with the at least one header switch; and a pair of cross-coupled inverters coupled to the at least one footer switch, wherein the second and the fifth switches are configured to be controlled with outputs of the inverters, wherein the first and the third switches are configured to be controlled with the latch enable signal, and the fourth and the sixth switches are configured to be controlled with a logical complement of the latch enable signal.

18. The method of claim 17, wherein the logic gates comprise OR-AND-Invert (OAI) logic gates.

19. The method of claim 17, wherein the logic circuit comprises:

a NAND gate having inputs configured to receive the gating control signal and the input clock signal; and an inverter having an input coupled to an output of the NAND gate, and an output configured to output the output clock signal.

20. The method of claim 17, wherein the latch is a set-reset (SR) latch.

* * * * *